United States Patent
Karlsson et al.

(10) Patent No.: US 6,660,578 B1
(45) Date of Patent: Dec. 9, 2003

(54) HIGH-K DIELECTRIC HAVING BARRIER LAYER FOR P-DOPED DEVICES AND METHOD OF FABRICATION

(75) Inventors: Olov Karlsson, San Jose, CA (US); Qi Xiang, San Jose, CA (US); HaiHong Wang, Fremont, CA (US); Bin Yu, Cupertino, CA (US); Zoran Krivokapic, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 4 days.

(21) Appl. No.: 10/118,274

(22) Filed: Apr. 8, 2002

(51) Int. Cl.[7] ............................................. H01L 21/8238
(52) U.S. Cl. .................. 438/199; 438/201; 438/211; 438/216; 438/286; 438/479
(58) Field of Search ................. 438/197, 199, 438/479, 201, 211, 216, 286; 257/274, 288, 315, 338, 347, 351

(56) References Cited

U.S. PATENT DOCUMENTS

| | | | |
|---|---|---|---|
| 6,013,553 A | 1/2000 | Wallace et al. | 438/287 |
| 6,020,024 A | 2/2000 | Maiti et al. | 427/248.1 |
| 6,040,207 A * | 3/2000 | Gardner et al. | 438/216 |
| 6,051,865 A | 4/2000 | Gardner et al. | 257/411 |
| 6,225,168 B1 | 5/2001 | Gardner et al. | 438/287 |
| 6,492,217 B1 * | 12/2002 | Bai et al. | 438/199 |
| 2003/0032251 A1 * | 2/2003 | Chen et al. | 438/311 |

* cited by examiner

Primary Examiner—W. David Coleman
Assistant Examiner—Hsien-Ming Lee
(74) Attorney, Agent, or Firm—Renner, Otto, Boisselle & Sklar, LLP

(57) ABSTRACT

A semiconductor device, a semiconductor wafer and a method of forming a semiconductor wafer where a barrier layer is used to inhibit P-type ion-penetration into a dielectric layer made from a high-K material.

7 Claims, 3 Drawing Sheets

HIGH-K DIELECTRIC HAVING BARRIER LAYER FOR P-DOPED DEVICES AND METHOD OF FABRICATION

TECHNICAL FIELD

The present invention relates generally to semiconductor devices and the fabrication thereof and, more particularly, to a dielectric layer and an associated barrier layer for use with P-doped devices, such as P-type metal oxide semiconductors (PMOS).

BACKGROUND

A pervasive trend in modern integrated circuit manufacture is to produce semiconductor devices (e.g., transistors, memory cells and so forth) having structural features that are as small as possible. Although the fabrication of smaller devices allows more devices to be placed on a single monolithic substrate for the formation of relatively large circuit systems in a relatively small die area, this downscaling can result in a number of performance degrading effects.

For example, metal oxide semiconductor field effect transistors (MOSFETs) are traditionally made with a gate dielectric layer for separating a gate electrode and a body region. The body region is formed in an active region of a layer of semiconductor material and is disposed between a source and a drain. The source and the drain are formed by implanting N-type or P-type impurities in the layer of semiconductor material. Although MOSFETs have successfully been used in the construction of a integrated circuits (e.g., complimentary metal oxide semiconductor (CMOS) integrated circuits), MOSFET reliability is susceptible to downscaling. For instance, gate dielectric breakdown and/or tunneling through the gate dielectric can occur in devices having a relatively thin gate dielectric (e.g., approaching about 10 Å) that is made from a traditional material (e.g., $SiO_2$).

Accordingly, there exists a need in the art for improved dielectric layers for semiconductor devices as well as techniques and structures for protecting the improved dielectric layers during various device fabrication steps.

SUMMARY OF THE INVENTION

According to one aspect of the invention, the invention is directed to a semiconductor device configured as a MOSFET. The semiconductor device includes a body formed between a source and a drain in an active region of a layer of semiconductor material; a gate electrode having P-type doping formed on the layer of semiconductor material above the body and separated from the body by a gate dielectric made from a layer of high-K material; and a barrier layer disposed between the gate dielectric and the gate electrode, the barrier layer inhibiting ion penetration into the gate dielectric during doping of the gate electrode.

According to another aspect of the invention, the invention is directed to a semiconductor wafer. The wafer includes a first group of semiconductor devices each including: a first semiconductor component receiving P-type doping; a second semiconductor component; a first high-K dielectric layer separating the first semiconductor component and the second semiconductor component; and a barrier layer disposed between the high-K dielectric layer and the first semiconductor component for inhibiting P-type ion penetration into the high-K dielectric layer during the P-type doping of the first semiconductor component. The wafer further includes a second group of semiconductor devices each including: a third semiconductor component; a fourth semiconductor component; and a second high-K dielectric layer separating the third semiconductor component and the fourth semiconductor component. The first high-K dielectric layer for each of the semiconductor devices from the first group is made from the same layer of high-K material as used to make the second high-K dielectric layer for each of the semiconductor devices from the second group.

According to yet another aspect of the invention, the invention is directed to a method of fabricating a wafer having a section for P-type doped semiconductor devices. The method includes providing a layer of semiconductor material; forming a high-K dielectric material layer on the layer of semiconductor material; forming a layer of barrier material on the high-K dielectric material layer and patterning the layer of barrier material to be coextensive with the section for P-type doped semiconductors; forming a layer of material to receive P-type doping on at least the layer of barrier material; and implanting the layer of material to receive P-type doping with P-type dopant and wherein the layer of barrier material inhibits P-type ion penetration into the high-K dielectric material layer during implantation.

BRIEF DESCRIPTION OF DRAWINGS

These and further features of the present invention will be apparent with reference to the following description and drawings, wherein.

DISCLOSURE OF INVENTION

Figure 1:
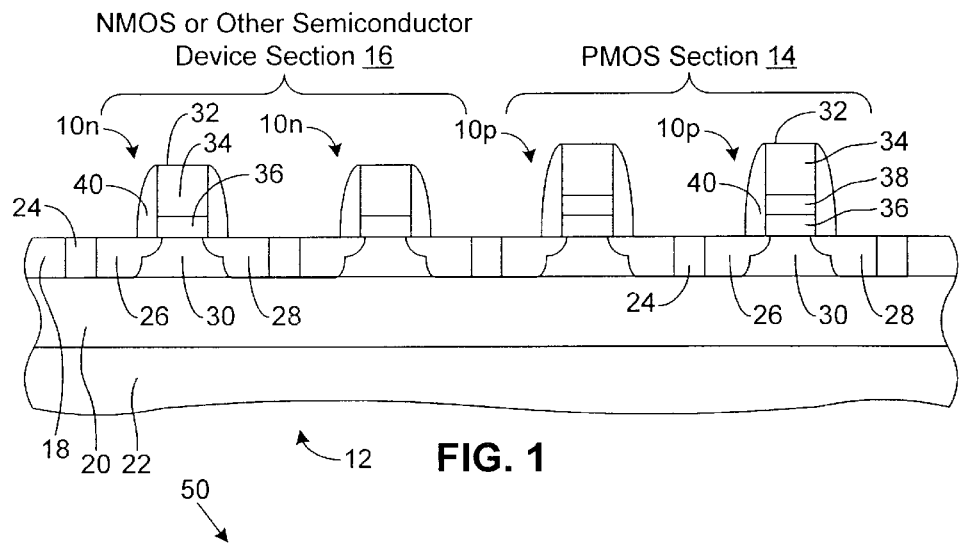
FIG. 1 is a schematic block diagram of a wafer having an exemplary set of semiconductor devices formed thereon, and certain illustrated semiconductor devices have a dielectric layer and associated barrier layer according to the present invention.

In the detailed description that follows, corresponding components have been given the same reference numerals, regardless of whether they are shown in different embodiments of the present invention. To illustrate the present invention in a clear and concise manner, the drawings may not necessarily be to scale and certain features may be shown in somewhat schematic form.

Certain aspects of the present invention relate to a dielectric layer and an associated barrier layer for use in semiconductor devices. Methods for fabricating the dielectric layer and associated barrier layer along with semiconductor devices are also discussed. Example semiconductor devices that can be formed using the dielectric and barrier layers described herein include metal oxide semiconductor field effect transistors (MOSFETs), and particularly MOSFETs having a gate electrode with P-type doping (i.e., PMOS, or P-channel devices). These MOSFETs can, for example, be used in the construction of a complimentary metal oxide semiconductor (CMOS) integrated circuit. One skilled in the art will appreciate that other types of semiconductor devices (e.g., memory cells, other types of transistors and the like) can benefit from the dielectric layer and barrier layer stack described herein.

With reference to FIG. 1, a plurality of semiconductor devices 10 formed on a wafer 12 is illustrated. As illustrated, some of the semiconductor devices 10 are PMOS devices 10p that are formed in a PMOS section 14 of the wafer 12. Formed in another section 16 of the wafer 12 are other semiconductor devices 10, such as MOSFETs having a gate electrode with N-type doping (i.e., NMOS, or N-channel devices) devices 10n and/or other non-PMOS semiconductor devices. As one skilled in the art will appreciate, the PMOS and NMOS devices illustrated in FIG. 1 are exemplary and various aspects of the invention can be applied to other types of semiconductor devices.

The wafer 12 includes a layer of semiconductor material 18. It is noted that in the illustrated embodiment of FIG. 1, the layer of semiconductor material 18 is a semiconductor film (such as silicon, germanium, silicon-germanium, stack of semiconductor materials, etc.) formed on a layer of insulating material 20. The insulating layer 20 is, in turn, formed on a semiconductor substrate 22 so that the resultant semiconductor devices 10 are formed in a semiconductor-on-insulator (SOI) format, as is well known in the art. Alternatively, the layer of semiconductor material 18 can be, for example, a silicon substrate for the formation of bulk-type devices.

Isolation regions 24 are formed in the layer of semiconductor material 18 to define the size and placement of active regions, from which the semiconductor devices 10 can be constructed. Within the layer of semiconductor material 18 and within one of the active regions, each PMOS device 10p and NMOS device 10n includes a source 26, a drain 28 and a body 30 disposed between the source 26 and the drain 28. In the illustrated embodiment, the source 26 and the drain 28 each include a deep doped region and an extension region as illustrated.

The gate 32 of each PMOS device 10p and NMOS device 10n also includes a gate 32. The gate 32 is disposed on the layer of semiconductor material 18 over he body 30 and defines a channel within the body 30 (the channel being interposed between the source 26 and the drain 28).

The gate 32 includes a gate electrode 34 spaced apart from the layer of semiconductor material 18 by a gate dielectric 36. In the illustrated embodiment, the ate dielectric 36 is made from a high-K material. High-K materials are discussed in greater detail below. However, for purposes herein, the term "high-K material" or "high-K dielectric material" refers to a material, or stack of materials, having a relative permittivity, or K, in one embodiment of about ten (10) or more, and in another embodiment of about twenty (20) or more. Relative permittivity is the ratio of the absolute permittivity ($\in$) found by measuring capacitance of the material to the permittivity of free space ($\in_o$), that is K=$\in$/$\in_o$. High-K materials will be described in greater detail below. Although other materials can be selected for the gate dielectric 36, hafnium oxide (e.g., $HfO_2$), zirconium oxide (e.g., $ZrO_2$), cerium oxide (e.g., $CeO_2$), aluminum oxide (e.g., $Al_2O_3$), titanium oxide (e.g., $TiO_2$), yttrium oxide (e.g., $Y_2O_3$) and barium strontium titanate (BST) are example suitable materials. In addition, all binary and ternary metal oxides and ferroelectric materials having a K higher than, in one embodiment, about twenty (20) can be used for the gate dielectric 36.

As used herein, a standard-K dielectric material refers to a dielectric material having a relative permittivity, or K, of up to about ten. Example standard-K dielectric materials include, for example, silicon dioxide (K of about 3.9), silicon oxynitride (K of about 4 to 8 depending on the relative content of oxygen and nitrogen) and silicon nitride (K of about 6 to 9).

When a high-K material is selected as the gate dielectric 36, the high-K material can have an equivalent oxide thickness (EOT) of about one nanometer (1 nm) or less. Use of a high-K material for the gate dielectric 36 is advantageous since the high-K material improves gate reliability. More specifically, in some devices, a dielectric layer made from a high-K material (or a stack of two or more layers including at least one layer of high-K material) may be desirable to avoid problems, such as break-down or tunneling. These problems can typically occur when the thickness of a standard-K dielectric material becomes thin (e.g., approaching about 10 Å). A high-K dielectric allows for the establishment of a suitable capacitance with a physically thicker dielectric layer. For example, a nitride gate dielectric having a K of about 7.8 and a thickness of about 100 Å is substantially electrically equivalent to an oxide gate dielectric having a K of about 3.9 and a thickness of about 50 Å.

Each PMOS device 10p includes an additional barrier layer 38 disposed between the gate electrode 34 and the gate dielectric 36. The barrier layer 38 is used to protect the high-K material of the gate dielectric 36 from ion-penetration when the gate electrode 34 is doped. For example, many high-K materials are sensitive to boron-penetration that can occur during doping of the gate electrodes 34. The barrier layer 38 can be made from, for example, silicon nitride, or any other suitable material. The barrier layer 38 can be formed using chemical vapor deposition (CVD) or other appropriate technique, including, for example, thermal oxynitridation. In one embodiment of the invention, the barrier layer 38 has a thickness of about 10 Å to about 50 Å.

As illustrated, the extensions may laterally diffuse a short distance under the gate 32, as is known in the art. In addition, sidewall spacers 40 can be used to assist in defining the placement of the deep implants.

Figure 2:
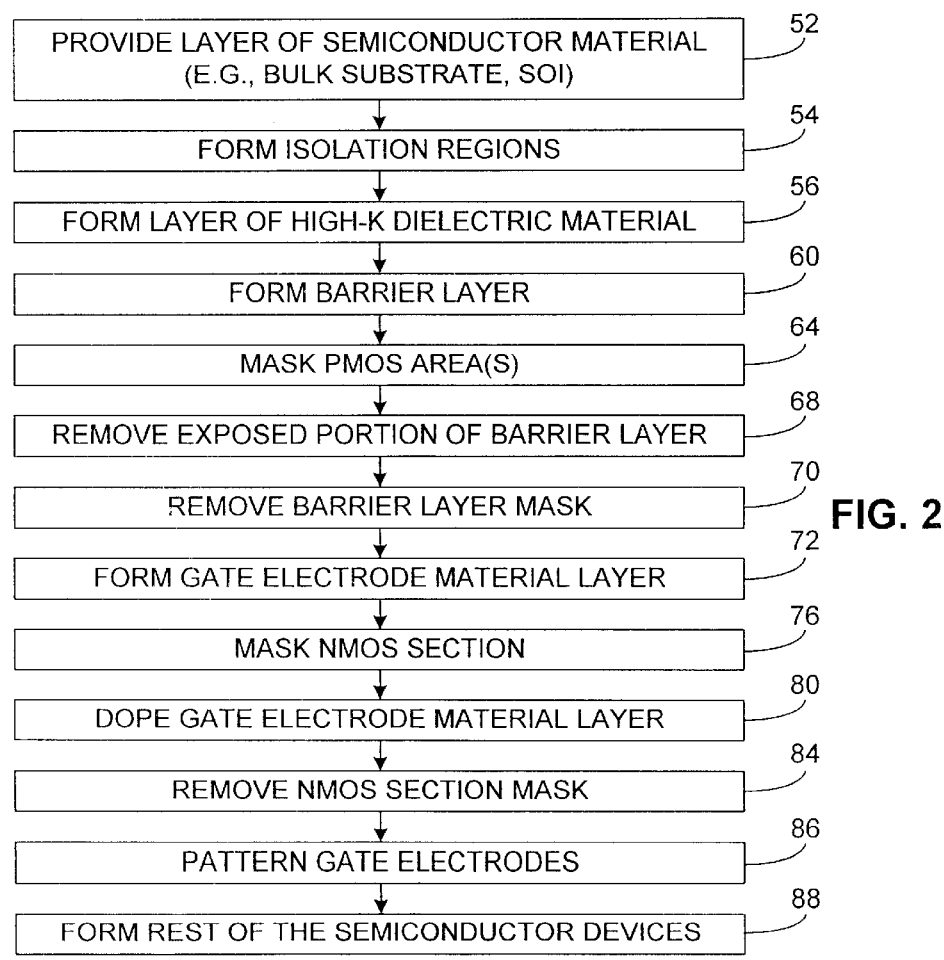
FIG. 2 is a flow chart illustrating a method for forming a wafer with the dielectric layer and associated barrier layer.
Figure 3A:
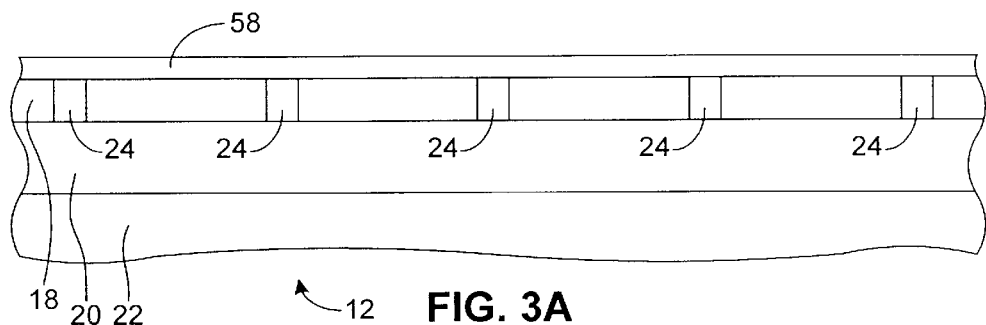
FIGS. 3A through 3F illustrate the exemplary wafer of FIG. 1 in various stages of manufacture.

Referring now to FIG. 2, a method 50 of forming semiconductor devices 10 including the high-K gate dielectric 36 and the barrier layer 38 is illustrated. With additional reference to FIG. 3A, the method 50 starts in step 52 where the layer of semiconductor material 18 is provided. As indicated above, the layer of semiconductor material 18 can be a semiconductor substrate (such as a silicon substrate) for the formation of bulk-type devices. However, in the illustrated example, the layer of semiconductor material 18 is a semiconductor film (such as a silicon film or a silicon-germanium film) formed as part of an SOI substrate stack. The layer of semiconductor material 18 can be implanted to have an initial doping for the subsequent forming of N-type or P-type body regions 30.

Next, in step 54, isolation regions 24 are formed in the layer of semiconductor material 18. The formation of isolation regions 24 (for example, shallow trench isolation (STI) regions, local oxidation of silicon (LOCOS) regions, and deep trench isolation (DTI) regions) is generally well known by those with ordinary skill in the art and will not be described in great detail.

Thereafter, in step 56, a high-K material layer 58 is grown or deposited on the layer of semiconductor material 18 and isolation regions 24 as illustrated. Exemplary high-K materials are identified below in Table 1. It is noted that Table 1 is not an exhaustive list of high-K materials and other high-K materials may be available.

TABLE 1

| Dielectric Material | Approximate Relative Permittivity (K) |
|---|---|
| aluminum oxide ($Al_2O_3$) | 9–10 |
| zirconium silicate | 12 |
| hafnium silicate | 15 |
| hafnium silicon oxynitride | 16 |
| hafnium silicon nitride | 18 |
| lanthanum oxide ($La_2O_3$) | 20–30 |
| hafnium oxide ($HfO_2$) | 40 |
| zirconium oxide ($ZrO_2$) | 25 |
| cerium oxide ($CeO_2$) | 26 |
| bismuth silicon oxide ($Bi_4Si_2O_{12}$) | 35–75 |
| titanium dioxide ($TiO_2$) | 30 |
| tantalum oxide ($Ta_2O_5$) | 26 |
| tungsten oxide ($WO_3$) | 42 |
| yttrium oxide ($Y_2O_3$) | 20 |
| lanthanum aluminum oxide ($LaAlO_3$) | 25 |
| barium strontium titanate ($Ba_{1-x}Sr_xTiO_3$) | ~20—200 |
| barium strontium oxide ($Ba_{1-x}Sr_xO_3$) | ~20—200 |
| $PbTiO_3$ | ~20—200 |
| barium titanate ($BaTiO_3$) | ~20—200 |
| strontium titanate ($SrTiO_3$) | ~20—200 |
| $PbZrO_3$ | ~20—200 |
| PST ($PbSc_xTa_{1-x}O_3$) | 3000 |
| PZN ($PbZn_xNb_{1-x}O_3$) | ~500—5000 |
| PZT ($PbZr_xTi_{1-x}O_3$) | ~100—1000 |
| PMN ($PbMg_xNb_{1-x}O_3$) | ~500—5000 |

It is noted that the K-values for both standard-K and high-K materials may vary to some degree depending on the exact nature of the dielectric material. Thus, for example, differences in purity, crystallinity and stoichiometry, may give rise to variations in the exact K-value determined for any particular dielectric material.

As used herein, when a material is referred to by a specific chemical name or formula, the material may include non-stoichiometric variations of the stoichiometrically exact formula identified by the chemical name. For example, tantalum oxide, when stoichiometrically exact, has the chemical formula $Ta_2O_5$, but may include variants of stoichiometric $Ta_2O_5$, which may be referred to as $Ta_xO_y$, in which either of x or y vary by a small amount. For example, in one embodiment, x may vary from about 1.5 to 2.5, and y may vary from about 4.5 to about 5.5. In another embodiment, x may vary from about 1.75 to 2.25, and y may vary from about 4 to about 6. Such variations from the exact stoichiometric formula fall within the definition of tantalum oxide. Similar variations from exact stoichiometry for all chemical names or formulas used herein are intended to fall within the scope of the present invention. For example, again using tantalum oxide, when the formula $Ta_2O_5$ is used, $Ta_xO_y$ is included within the meaning. Thus, in the present disclosure, exact stoichiometry is intended only when such is explicitly so stated. As will be understood by those of skill in the art, such variations may occur naturally, or may be sought and controlled by selection and control of the conditions under which materials are formed.

Figure 3B:
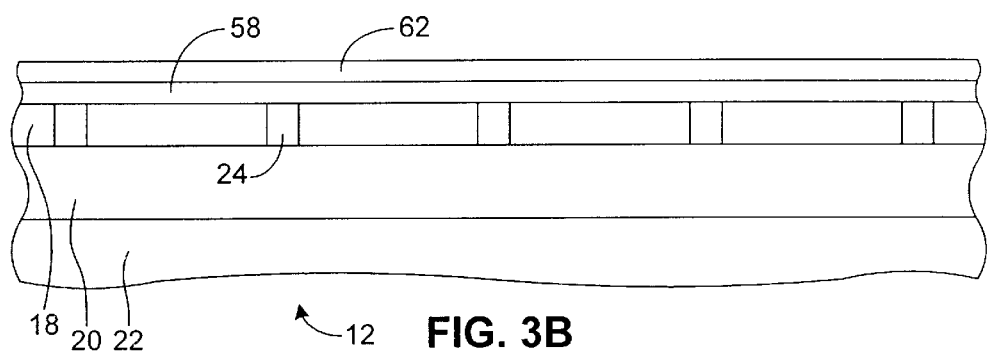

With additional reference to FIG. 3B, the method 50 continues in step 60 where a layer of barrier material 62 is formed over the high-K material layer 58. The layer of barrier material 62 can be formed from a nitride, such as silicon nitride (SiN), or other suitable material (e.g., silicon oxynitride) that functions to minimize ion-penetration into the underlying high-K material layer 58. As indicated above, CVD can be used to deposit the layer of barrier material 62.

Figure 3C:
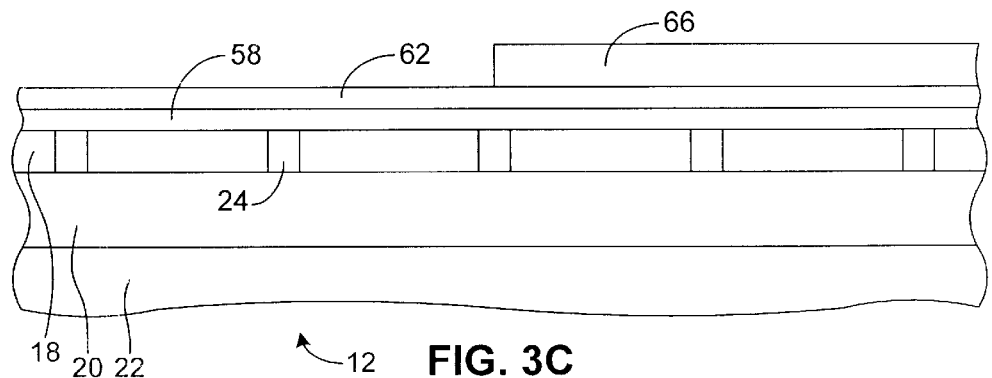

Thereafter, in step 64 and as illustrated in FIG. 3C, a mask layer 66 is formed on the layer of barrier material 62. The mask is then patterned to expose the layer of barrier material 62 in the NMOS section 16 (FIG. 1) of the wafer 12 and leave the mask layer 66 over the PMOS section 14 (FIG. 1) of the wafer 12. It is noted that the wafer 12 may have more than one PMOS section 14 and, in that event, the mask layer 66 would be patterned to remain over each PMOS section 14.

Figure 3D:
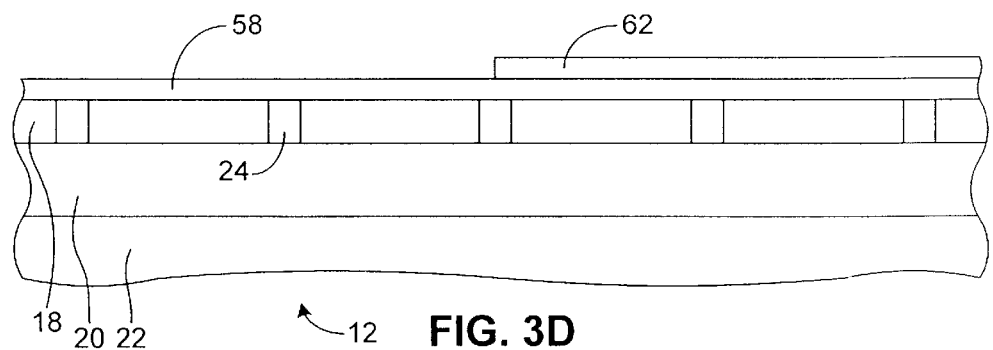

Next, in step 68 and with additional reference to FIG. 3D, the unmasked portions of the layer of barrier material 62 are removed using an appropriate technique, such as chemical wet etching or dry etching. Once the undesired portions of the layer of barrier material 62 are removed, the remaining portion(s) of the mask 66 is removed in step 70. In an alternative embodiment, the NMOS devices 16 can include barrier layers similar to the barrier layers 38 illustrated in FIG. 1 for the PMOS devices 10p. In this embodiment, steps 68 and 70 can be omitted.

Figure 3E:
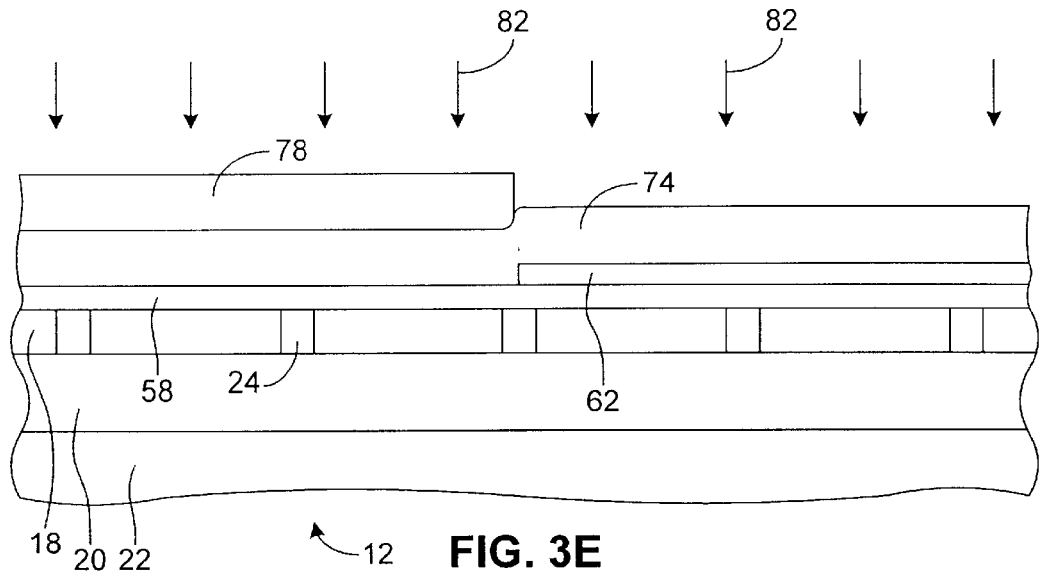

With additional reference to FIG. 3E, the method continues in step 72 where a layer of gate electrode material 74 is formed on the layer of barrier material 62 and exposed areas of the high-K material layer 58. In one embodiment, the layer of gate electrode material 74 can be, for example, polysilicon. However, other gate electrode materials and/or stacks of material layers can be used to form the layer of gate electrode material 74. Alternative materials include, for example, polysilicon-germanium, titanium-nitride (e.g., TiN), tungsten (W), tantalum nitride (e.g., TaN, $Ta_3N_5$), etc.

Following formation of the layer of gate electrode material 74, the NMOS section(s) 16 (FIG. 1) of the wafer 12 is masked in step 76. More specifically, a mask 78 is formed on top of the layer of gate electrode material 74 and patterned to exposed the PMOS sections 14 of the wafer 12 and any other desired sections of the wafer.

After the mask 78 is formed, the layer of gate electrode material 74 is implanted in step 80 with ions 82 so that P-type gate electrodes can be formed from the PMOS section 14 of the layer of gate electrode material 74. The mask 78 inhibits ion implantation of the NMOS section 16 of the wafer 12. The NMOS section 16 can be implanted in separate processing steps so that N-type gate electrodes can be formed from the NMOS section 16 of the layer of gate electrode material 74.

In one embodiment, the implanted ions 82 are boron. However, other appropriate ion species (for example, gallium and indium) can also be used. In one example, boron ions can be implanted with an energy of about 2 keV to about 10 keV and a dose of about $1\times10^{14}$ atoms/cm$^2$ to about $1\times10^{16}$ atoms/cm$^2$. Following dopant implantation, a thermal anneal cycle can optionally be carried out to recrystallize the layer of gate electrode material 74.

During implantation of the ions 82, the layer of barrier material 62 inhibits ion 82 penetration into the high-K material layer 58.

Figure 3F:
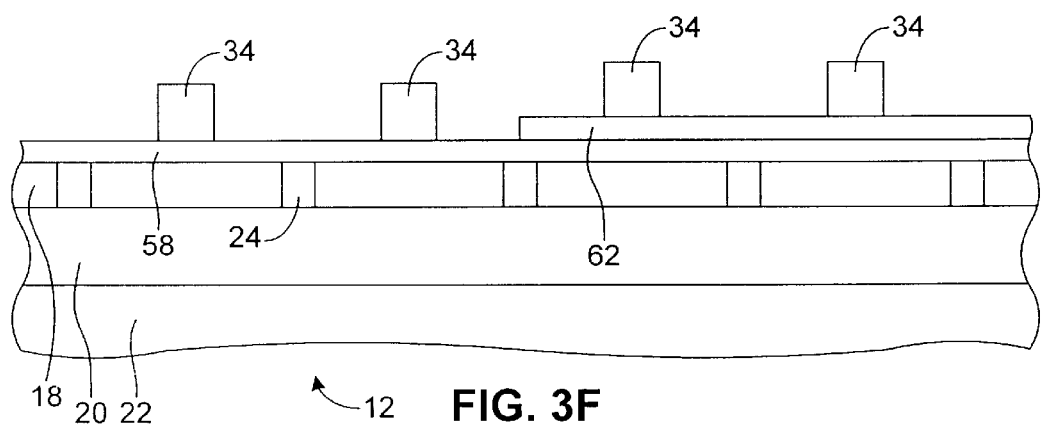

Following dopant implantation, the mask 78 is removed in step 84. Thereafter, and with additional reference to FIG. 3F, the layer of gate electrode material 74 can be patterned into the gate electrodes 34 in step 86 using conventional techniques.

As one skilled in the art will appreciate, the masking step 76, the doping step 80 and the mask removal step 84 can be deferred until after the individual gate electrodes 34 are patterned in step 86. Alternatively, doping of the gate electrodes 34 can be combined with the implantation steps described below to form the source 26 and drain 28 of the PMOS devices 10p. In these alternatives, the barrier layer 38 will serve serves to inhibit ion penetration into the gate dielectric 36.

The method continues in step 88 where the semiconductor devices 10 are formed. With reference to FIG. 1, the high-K material layer 58 and the layer of barrier material 62 can be patterned to be coextensive with the gate electrodes 34, thus forming the gate electrodes 36 and the barrier layers 38. Depending on dopant species used to form the source 26 and drain 28 extensions and deep doped regions, the patterning of the high-K material layer 58 and the layer of barrier material 62 can be carried out following the implantation steps described below.

The extensions can be implanted by using well known techniques such as a lightly doped drain (LDD) technique. Briefly, for a P-type extension region, ions such as boron, gallium or indium can be implanted. For an N-type extension region, ions such as antimony, phosphorous or arsenic can be implanted. The ions used to form the extensions may diffuse slightly under the gate 34 as is conventional.

Other processing in step 88 can include formation of the sidewall spacers 40. The spacers 40 can be formed from a material such as a nitride (e.g., silicon nitride, or $Si_3N$). The formation of the spacers 40 is well known in the art and will not be described in greater detail.

The spacers 40 and the gate 34 act as a self-aligned mask for implantation of the deep doped regions. Implanting dopant species to form the deep doped regions of the source 26 and the drain 28, respectively, is well known in the art and will not be described in great detail herein. Briefly, to form a P-type deep doped region, ions such as boron, gallium or indium can be implanted. N-type deep doped regions can be formed by implanting ions, such as antimony, phosphorous or arsenic. Following implantation of the deep doped source and drain regions, an anneal cycle can be carried out to activate the dopant species and/or to recrystallize the layer of semiconductor material 18. It is noted that the ions used to form the deep doped regions may laterally diffuse slightly under the spacers 40 as is conventional.

Other additional processing can include for example, the formation of a source 26 contact, a drain 28 contact and a gate electrode 38 contact for each semiconductor device 10. If desired, the contacts can be formed using a silicidation process as is known in the art. An oxide cap (or passivation layer) can also be formed.

The method 50 shows in a specific order of steps for fabricating the semiconductor devices 10. However, it is understood that the order may differ from that depicted. For example, the order of two or more steps may be altered relative to the order shown. Also, two or more steps may be carried out concurrently or with partial concurrence. In addition, various steps may be omitted and other steps may be added. It is understood that all such variations are within the scope of the present invention.

Although particular embodiments of the invention have been described in detail, it is understood that the invention is not limited correspondingly in scope, but includes all changes, modifications and equivalents coming within the spirit and terms of the claims appended hereto.

What is claimed is:

1. A method of fabricating a wafer having a section for P-type doped semiconductor devices, comprising:
   providing a layer of semiconductor material;
   forming a high-K dielectric material layer on the layer of semiconductor material;
   forming a layer of barrier material on the high-K dielectric material layer and patterning the layer of barrier material to be coextensive with the section for P-type doped semiconductor devices;
   forming a layer of material to receive P-type doping on at least the layer of barrier material; and
   implanting the layer of material to receive P-type doping with P-type dopant and wherein the layer of barrier material inhibits P-type ion penetration into the high-K dielectric material layer during implantation; and
   wherein the layer of material to receive P-type doping is also formed on a section of the high-K dielectric material layer left exposed following patterning of the layer of barrier material, and the method further comprising masking a section of the layer of material to receive P-type doping formed on the high-K dielectric material prior to the implanting of P-type dopant.

2. The method according to claim 1, wherein the P-type dopant is boron ions.

3. The method according to claim 1, wherein the barrier layer is made from silicon nitride.

4. The method according to claim 3, wherein the barrier layer is formed using chemical vapor deposition (CVD).

5. The method according to claim 1, wherein the high-K material is composed of one or more materials selected from the group consisting of hafnium oxide, zirconium, oxide cerium oxide, aluminum oxide, titanium oxide, yttrium oxide, barium strontium titanate (BST) and mixtures thereof.

6. The method according to claim 1, wherein the layer of semiconductor material is a semiconductor film disposed on an insulating layer, the insulting layer being disposed on a semiconductor substrate.

7. The method according to claim 1, wherein the barrier layer has a thickness of about 10 Å to about 50 Å.

* * * * *

UNITED STATES PATENT AND TRADEMARK OFFICE
CERTIFICATE OF CORRECTION

PATENT NO. : 6,660,578 B1 Page 1 of 1
DATED : December 9, 2003
INVENTOR(S) : Karlsson et al.

It is certified that error appears in the above-identified patent and that said Letters Patent is hereby corrected as shown below:

Column 6,
Line 40, replace "zirconium, oxide" with -- zirconium oxide, --
Line 66, remove "serves".

Signed and Sealed this

Third Day of February, 2004

JON W. DUDAS
*Acting Director of the United States Patent and Trademark Office*